US010347815B1

(12) United States Patent
Sleator

(10) Patent No.: US 10,347,815 B1
(45) Date of Patent: Jul. 9, 2019

(54) PIEZOELECTRIC STRANDS FOR TACTILE SENSING

(71) Applicant: X Development LLC, Mountain View, CA (US)

(72) Inventor: Michael George Sleator, Woodside, CA (US)

(73) Assignee: X DEVELOPMENT LLC, Mountain View, CA (US)

( * ) Notice: Subject to any disclaimer, the term of this patent is extended or adjusted under 35 U.S.C. 154(b) by 519 days.

(21) Appl. No.: 14/978,833

(22) Filed: Dec. 22, 2015

(51) Int. Cl.
| | |
|---|---|
| *G01L 3/00* | (2006.01) |
| *H01L 41/08* | (2006.01) |
| *H01L 41/113* | (2006.01) |
| *H01L 41/04* | (2006.01) |
| *B25J 19/02* | (2006.01) |

(52) U.S. Cl.
CPC .......... *H01L 41/082* (2013.01); *B25J 19/028* (2013.01); *H01L 41/042* (2013.01); *H01L 41/1132* (2013.01); *Y10S 901/46* (2013.01)

(58) Field of Classification Search
CPC ............................. H01L 41/082; B25J 19/028
USPC ........................................................ 310/328
See application file for complete search history.

(56) References Cited

U.S. PATENT DOCUMENTS

| | | | |
|---|---|---|---|
| 4,634,917 A | 1/1987 | Dvorsky et al. | |
| 5,209,126 A | 5/1993 | Grahn | |
| 5,760,530 A | 6/1998 | Kolesar | |
| 8,161,826 B1 * | 4/2012 | Taylor | G01L 1/18 73/862.041 |
| 8,327,721 B2 | 12/2012 | Bratkovski et al. | |
| 2002/0194934 A1 * | 12/2002 | Taylor | G01L 1/205 73/862.046 |
| 2003/0056351 A1 * | 3/2003 | Wilkie | H01L 41/082 29/25.35 |
| 2009/0207493 A1 * | 8/2009 | Ohashi | B08B 7/02 359/507 |
| 2011/0261021 A1 * | 10/2011 | Modarres | G06F 3/016 345/177 |
| 2015/0022491 A1 | 1/2015 | Dumitru et al. | |
| 2016/0072042 A1 * | 3/2016 | Fukuda | B62M 3/00 310/338 |

OTHER PUBLICATIONS

Gu, J. F., Gorgutsa, S., & Skorobogatiy, M. (2011). A fully woven touchpad sensor based on soft capacitor fibers. arXiv preprint arXiv:1106.3881 Jan. 1, 2011.

(Continued)

*Primary Examiner* — Bryan P Gordon
(74) *Attorney, Agent, or Firm* — Middleton Reutlinger

(57) ABSTRACT

Methods and apparatus related to arrays of piezoelectric strands. Some implementations are directed to using an array of piezoelectric strands, along with associated driving and sensing components, to enable determination of one or more properties of external force(s) applied to the array, such as what areas of the array have external force being applied, a measure of the applied external force(s), material properties of object(s) applying the external force(s), etc. Each of the piezoelectric strands of an array may include at least a longitudinally extending piezoelectric material and a longitudinally extending conductive electrode.

16 Claims, 10 Drawing Sheets

(56) References Cited

OTHER PUBLICATIONS

Ambience 08, International Scientific Conference; Proceeding 2008, "Smart Textiles—Technology and Design"; Boras, Sweden; 222 pages. Jan. 1, 2008.

Rekimoto, J., Ishizawa, T., Schwesig, C., & Oba, H. (Nov. 2003). PreSense: Interaction Techniques for Finger Sensing Input Devices. In Proceedings of the 16th annual ACM symposium on User interface software and technology (pp. 203-212). ACM. Nov. 1, 2003.

Johnsson, M., & Balkenius, C. (Jun. 2011). Sense of Touch in Robots with Self-Organizing Maps. Robotics, IEEE Transactions on, 27(3), pp. 498-507. Jan. 1, 2011.

\* cited by examiner

PIEZOELECTRIC STRANDS FOR TACTILE SENSING

BACKGROUND

In the robotics industry and/or other scenarios, it may be it may be desirable to be able to ascertain when an object is applying force to a certain area, the degree of force being applied, and/or one or more properties of the object. For example, it may be beneficial for one or more components of a robot, such as an end effector of the robot, to have some degree of a "tactile sense".

In the robotics industry, contact forces may be determined from force and torque data sensed at mechanical joints of the robot. For example, a robotic gripper may include one or more sensors at its mechanical joint(s) to enable determination of when the gripper contacts an object and/or the force of the contact with the object. However, data from the sensors at the mechanical joints may not enable determination of what portions of the gripper are contacting the object, the forces of the contact at those portions, and/or other determinations related to the object or the contact with the object.

Other contact and force sensing technologies exist in the robotics and other industries. For example, a plurality of independent piezoelectric sensors have been proposed to sense contact and/or force. However, independent piezoelectric sensors present one or more drawbacks. For example, in response to initial contact of a piezoelectric sensor by an object, the sensor may create an electrical output that can be used to determine the initial contact. However, if the object is thereafter static, or moves only slightly, the piezoelectric sensors may not create additional electrical output that could be used to enable determination that the contact with the object has been maintained. Additional and/or alternative drawbacks of the aforementioned techniques and/or other techniques may be presented.

SUMMARY

The present disclosure is generally directed to arrays of piezoelectric strands. Some implementations of the present disclosure are generally directed to using an array of piezoelectric strands, along with associated driving and sensing components, to enable determination of one or more properties of external force(s) applied to the array, such as what areas of the array have external force being applied, a measure of the applied external force(s), material properties of object(s) applying the external force(s), etc. An external force may be applied to a portion of an array of piezoelectric strands as a result of an object resting on the portion of the array (i.e., the mass of the object times gravity), as a result of the array grasping or otherwise being actively "pressed" against the object, and/or as a result of the object being actively "pressed" against the array.

Each of the piezoelectric strands of the array includes at least a longitudinally extending piezoelectric material and a longitudinally extending conductive electrode. As described in more detail herein, in some implementations the piezoelectric strands of the array may be arranged either in two distinct layers or in an interwoven arrangement. In some implementations, the piezoelectric strands of the array are flexible, which may enable the array to be provided over a variety of non-planar surfaces. In some implementations, apparatus and methods described herein may be utilized to determine external force being applied to one or more areas of an array, even when the object(s) applying the external force(s) are static.

In some implementations, an apparatus is provided that includes a plurality of strands arranged in a first group and a second group. The strands of the first group and the strands of the second group intersect at a plurality of intersection areas. Each of the strands comprises a longitudinally extending piezoelectric material and a longitudinally extending conductive electrode. The apparatus further includes at least one electronic driver electronically coupled to the strands of the first group and applying one or more driver electrical outputs selectively to the conductive electrodes of the strands of the first group. The apparatus further includes at least one sensor electronically coupled to the conductive electrodes of the strands of the second group and sensing piezoelectric electrical outputs generated by the piezoelectric material of the strands of the second group. The piezoelectric material of each of the strands of the first group has a mechanical reaction in response to application of a corresponding one of the electrical outputs to the conductive electrode of the strand. Each of a plurality of the piezoelectric electrical outputs is generated by the piezoelectric material of a corresponding strand of the strands of the second group in response to mechanical stress applied to the corresponding strand by the mechanical reaction of one of the strands of the first group.

This and other implementations of technology disclosed herein may each optionally include one or more of the following features.

In some implementations, the strands of the first group are interwoven with the strands of the second group.

In some implementations, the strands of the first group are in a first layer and the strands of the second group are in a second layer. In some of those implementations, the intersecting at the plurality of intersection areas is a right angle intersection at each of the intersection areas. In some of those implementations, the apparatus further includes a shielding material interposed between the strands of the first group and the strands of the second group and/or a laminating material at least partially encapsulating all of the strands of the first group and the second group. The laminating material may be conductive or non-conductive. In some implementations that include a non-conductive laminating material, the apparatus further includes a conductive material contacting all of the strands of the first group and all of the strands of the second group.

In some implementations, the strands of the first group and the strands of the second group are abutting at the plurality of intersection areas. In some of those implementations, the abutting at the plurality of intersection areas is a contacting abutment at each of the intersection areas when no external force is applied to the apparatus and when no electrical output is provided by the electronic driver.

In some implementations, the conductive electrode of a given strand of the strands forms a core of the given strand, and the piezoelectric material of the given strand immediately surrounds the conductive electrode. In some of those implementations, the given strand further comprises a longitudinally extending additional conductive electrode that immediately surrounds the piezoelectric material of each of the strands. In some versions of those implementations, the given strand may further include an electrically insulating layer surrounding the additional conductive electrode.

In some implementations, a method is provided that includes applying an electrical output to a piezoelectric strand that intersects each of a plurality of intersecting piezoelectric strands at a corresponding intersection area. Applying the electrical output generates a mechanical reaction by the piezoelectric strand. The method further includes receiving, from each of the intersecting piezoelectric strands, a corresponding piezoelectric electrical output generated by the intersecting piezoelectric strand. The corresponding piezoelectric electrical output of each of the intersecting piezoelectric strands is generated in response to mechanical stress applied to the intersecting piezoelectric strand at the corresponding intersection area as a result of the mechanical reaction by the piezoelectric strand. The method further includes determining, based at least in part on the corresponding piezoelectric electrical outputs, whether any external force is being applied at each of the corresponding intersection areas.

This and other implementations of technology disclosed herein may each optionally include one or more of the following features.

In some implementations, the method further includes determining a measure of force being applied at a given intersection area of the corresponding intersection areas. Determining the measure of force may be based on the corresponding piezoelectric electrical output of a given intersecting piezoelectric strand of the intersecting piezoelectric strands. The given intersecting piezoelectric strand intersects the piezoelectric strand at the given intersection area.

In some implementations, applying the electrical output to the piezoelectric strand comprises varying a frequency of the electrical output during the applying. In some of those implementations, the method further includes determining a material property of an object applying the external force at a given intersection area of the corresponding intersection areas. Determining the material property may be based on one or more variances in the corresponding piezoelectric electrical output of a given intersecting piezoelectric strand of the intersecting piezoelectric strands. The given intersecting piezoelectric strand intersects the piezoelectric strand at the given intersection area.

In some implementations, the method further includes applying additional electrical output to an additional piezoelectric strand that intersects each of the intersecting piezoelectric strands at a corresponding additional intersection area. Applying the additional electrical output to the additional piezoelectric strand occurs after applying the electrical output to the piezoelectric strand, and applying the additional electrical output to the additional piezoelectric strand generates an additional mechanical reaction by the additional piezoelectric strand. In some of those implementations, the method further includes receiving, from each of the intersecting piezoelectric strands, a corresponding additional piezoelectric electrical output generated by the intersecting piezoelectric strand, and determining, based at least in part on the corresponding additional piezoelectric electrical outputs, whether any external force is being applied at each of the corresponding additional intersection areas. The corresponding additional piezoelectric electrical output of each of the intersecting piezoelectric strands is generated in response to mechanical stress applied to the intersecting piezoelectric strand at the corresponding additional intersection area as a result of the mechanical reaction by the additional piezoelectric strand.

In some implementations, a method is provided that includes applying an electrical output to a piezoelectric strand of an array of piezoelectric strands coupled to a robotic component of a robot. The piezoelectric strand intersects each of a plurality of intersecting piezoelectric strands at a corresponding intersection area. Applying the electrical output generates a mechanical reaction by the piezoelectric strand. The method further includes receiving, from each of the intersecting piezoelectric strands, a corresponding piezoelectric electrical output generated by the intersecting piezoelectric strand. The corresponding piezoelectric electrical output of each of the intersecting piezoelectric strands is generated in response to mechanical stress applied to the intersecting piezoelectric strand at the corresponding intersection area as a result of the mechanical reaction by the piezoelectric strand. The method further includes generating, based at least in part on the corresponding piezoelectric electrical outputs, one or more control commands to control at least one actuator of the robot. The at least one actuator controls the robotic component and/or an additional robotic component of the robot.

This and other implementations of technology disclosed herein may each optionally include one or more of the following features.

In some implementations, the at least one actuator controls only the robotic component.

In some implementations, the at least one actuator controls the additional robotic component and does not control the robotic component.

Other implementations may include a non-transitory computer readable storage medium storing instructions executable by a processor to perform a method such as one or more of the methods described above. Yet other implementations may include a robot and/or other apparatus including memory and one or more processors operable to execute instructions, stored in the memory, to perform a method such as one or more of the methods described above.

It should be appreciated that all combinations of the foregoing concepts and additional concepts described in greater detail herein are contemplated as being part of the subject matter disclosed herein. For example, all combinations of claimed subject matter appearing at the end of this disclosure are contemplated as being part of the subject matter disclosed herein.

DETAILED DESCRIPTION

Figure 1:
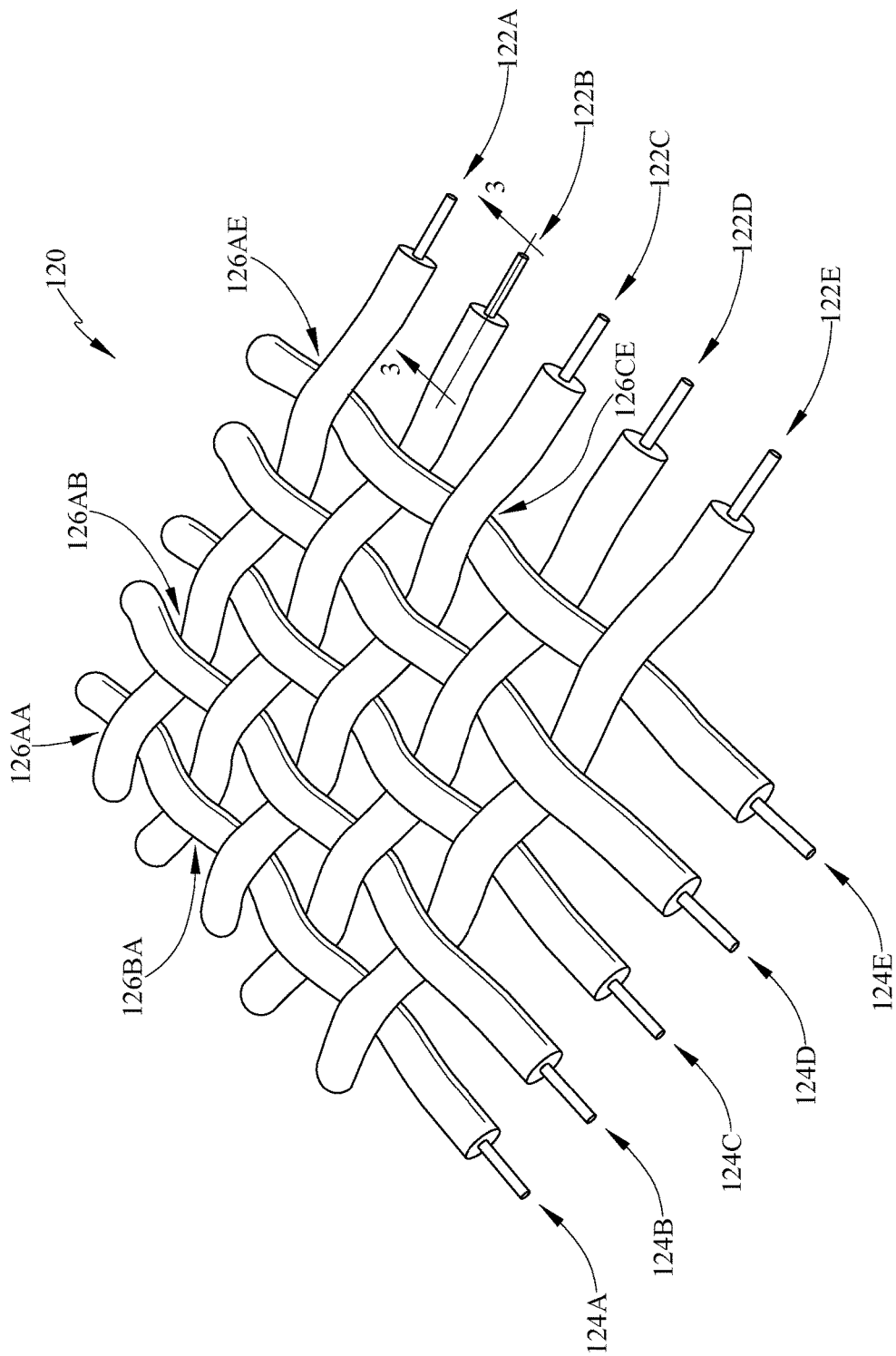
FIG. 1 illustrates a perspective view of an example array of piezoelectric strands in an interwoven arrangement.

FIG. 1 illustrates a perspective view of an example array 120 of piezoelectric strands 122A-E and 124A-E in an interwoven arrangement. The piezoelectric strands 122A-E are interwoven with the piezoelectric strands 124A-E. In FIG. 1, the piezoelectric strands 122A, 122C, and 122E pass over top of piezoelectric strands 124A, 124C, and 124E and pass under piezoelectric strands 124B and 124D. The piezoelectric strands 122B and 122D pass under piezoelectric strands 124A, 124C, and 124E and pass over piezoelectric strands 124B and 124D.

Figure 2:
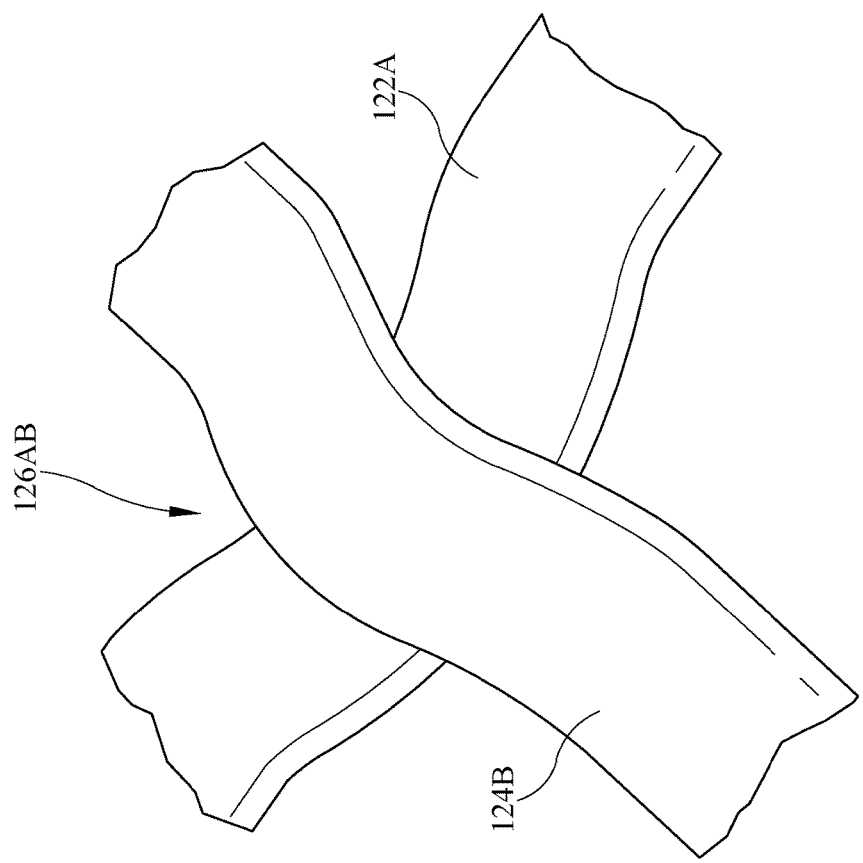
FIG. 2 illustrates a close-up view of one of the intersection areas of the array of FIG. 1.

The piezoelectric strands 122A-E and 124A-E intersect and abut one another at a plurality of intersection areas. For example, piezoelectric strand 122A intersects and abuts each of piezoelectric strands 124A-E at a corresponding intersection area. There are twenty-five separate intersection areas in the example array 120 of FIG. 1. However, for the sake of simplicity only five intersection areas 126AA, 126AB, 126BA, 126AE, and 126CE are provided with numbering in FIG. 1. In FIG. 2, a close up view of the intersection area 126AB where piezoelectric strands 122A and 124B intersect and abut is illustrated. As used herein, "abut" means contacting or in close proximity (e.g., within 5 millimeters). In some implementations, the piezoelectric strands 124A-E and the piezoelectric strands 122A-E abut at their corresponding intersection areas when no external force is being applied to the array 120 and when no electrical output is being provided to any of the piezoelectric strands 122A-E and 124A-E.

In some implementations, the piezoelectric strands 122A-E and 124A-E of the array 120 are flexible, which may enable the array 120 to be provided over a variety of non-planar surfaces. For example, the array 120 may be deformed into compound curves when placed over a surface with compound curves. For instance, the array 120 may be provided over one or more non-planar surfaces of one or more robotic components, such as an end effector of a robot, an "arm" of a robot (e.g., an arm that includes an end effector on a distal end), a "body" of a robot, and/or a "base" of a robot. The array 120 may optionally be covered (e.g., at least partially wrapped, embedded in) by a cloth, elastomer, and/or other material for aesthetics and/or to shield the piezoelectric strands 122A-E and 124A-E and/or other components from moisture, debris, and/or other object(s). In some implementations where the array 120 is deformed into one or more compound curves, the relative locations of one or more of the intersection areas may shift from the locations depicted in FIG. 1. In some of those implementations, calibration may optionally be performed to map the locations of the intersection areas to their shifted locations. The shifted locations may be mapped relative to a reference frame, such as a reference frame of the array 120 and/or a reference frame of a robot and/or robot component (e.g., a reference frame of an end effector).

Although a specific interwoven arrangement is illustrated in FIG. 1, variations are possible. For example, in some implementations the piezoelectric strands 122A-E may not be equidistantly spaced relative to one another and/or the piezoelectric strands 124A-E may not be equidistantly spaced relative to one another. Also, for example, in some implementations, the weave pattern of one or more of the piezoelectric strands 122A-E and 124A-E may not follow the "above, below, above, below . . . " pattern illustrated in FIG. 1. For instance, in some implementations, the weave pattern of one or more of the piezoelectric strands 122A-E and 124A-E may follow an "above, below, below, above, below, below, above . . . " pattern and/or other periodic or non-periodic pattern. As yet another example, a greater or lesser quantity of piezoelectric strands 122A-E and/or 124A-E may be provided.

Figure 3:
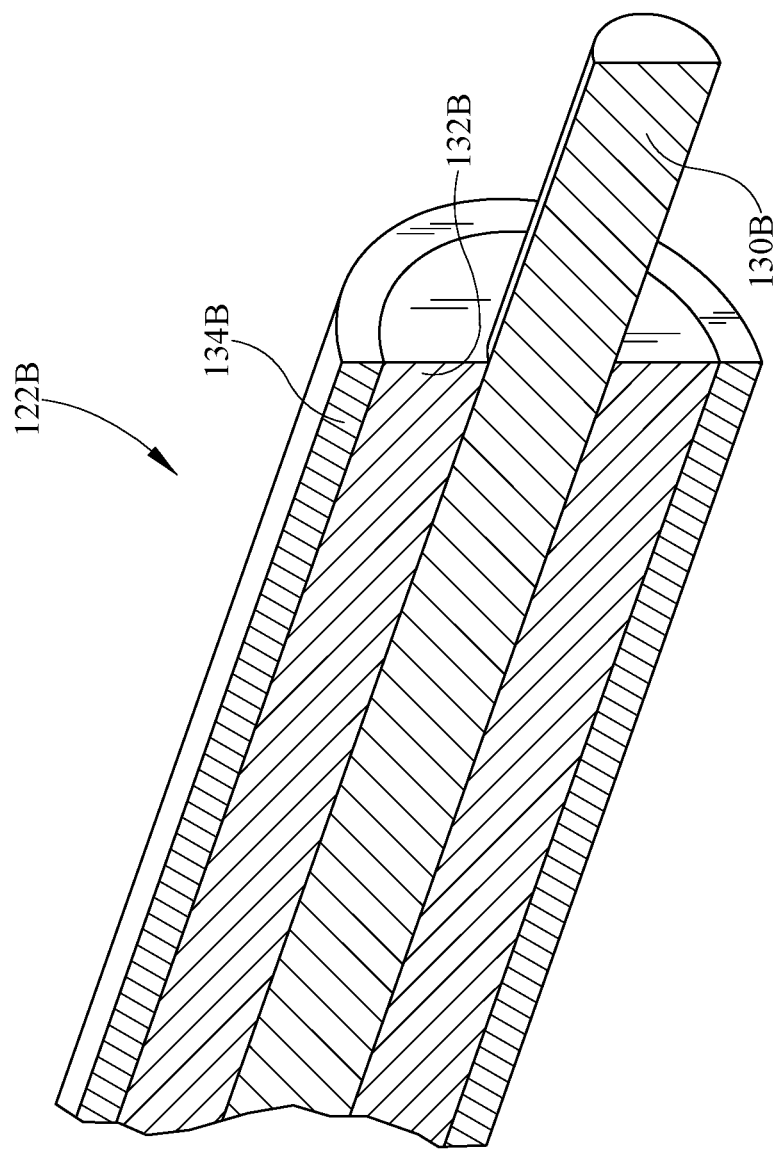
FIG. 3 illustrates a section view of a portion of one of the piezoelectric strands of FIG. 1, taken along the section line 3-3 of FIG. 1.

FIG. 3 illustrates a section view of a portion of one of the piezoelectric strands 122B of FIG. 1, taken along the section line 3-3 of FIG. 1. In some implementations, each of the piezoelectric strands 124A-E and each of the piezoelectric strands 122A-E may have the same and/or a similar construct as piezoelectric strand 122B. The piezoelectric strand 122B of FIG. 3 has a coaxial configuration and includes a longitudinally extending inner conductive electrode 130B that forms a core and is immediately surrounded by a longitudinally extending piezoelectric material 132B, which is immediately surrounded by a longitudinally extending outer conductive electrode 134B.

As described herein, the piezoelectric material 132B induces an electrical field across its boundaries when a mechanical stress is applied to it, or vice versa (an electrical field applied across its boundaries induces a mechanical reaction). The piezoelectric material 132B can be any one of various types of piezoelectric materials. For example, the piezoelectric material 132B may be a piezoelectric polymer, such as a bulk polymer (e.g., PVDF or PVDF copolymer), a piezoelectric composite polymer, or a voided charged polymer (e.g., cellular polypropylene). The inner conductive electrode 130B and/or the outer conductive electrode 134B may be any of various types of conductive materials, such as a metallic conductive material and/or a non-metallic conductive material (e.g., conductive polymer or conductive elastomer). As described herein, in some implementations the piezoelectric material 132B, the inner conductive electrode 130B, and the outer conductive electrode 134B are each flexible. In some implementations, the piezoelectric material 132B may have an electric field orientation that is radially symmetric about the inner conductive electrode 130B and a desired mechanical strain that is in line with the electric field orientation.

Figure 8:
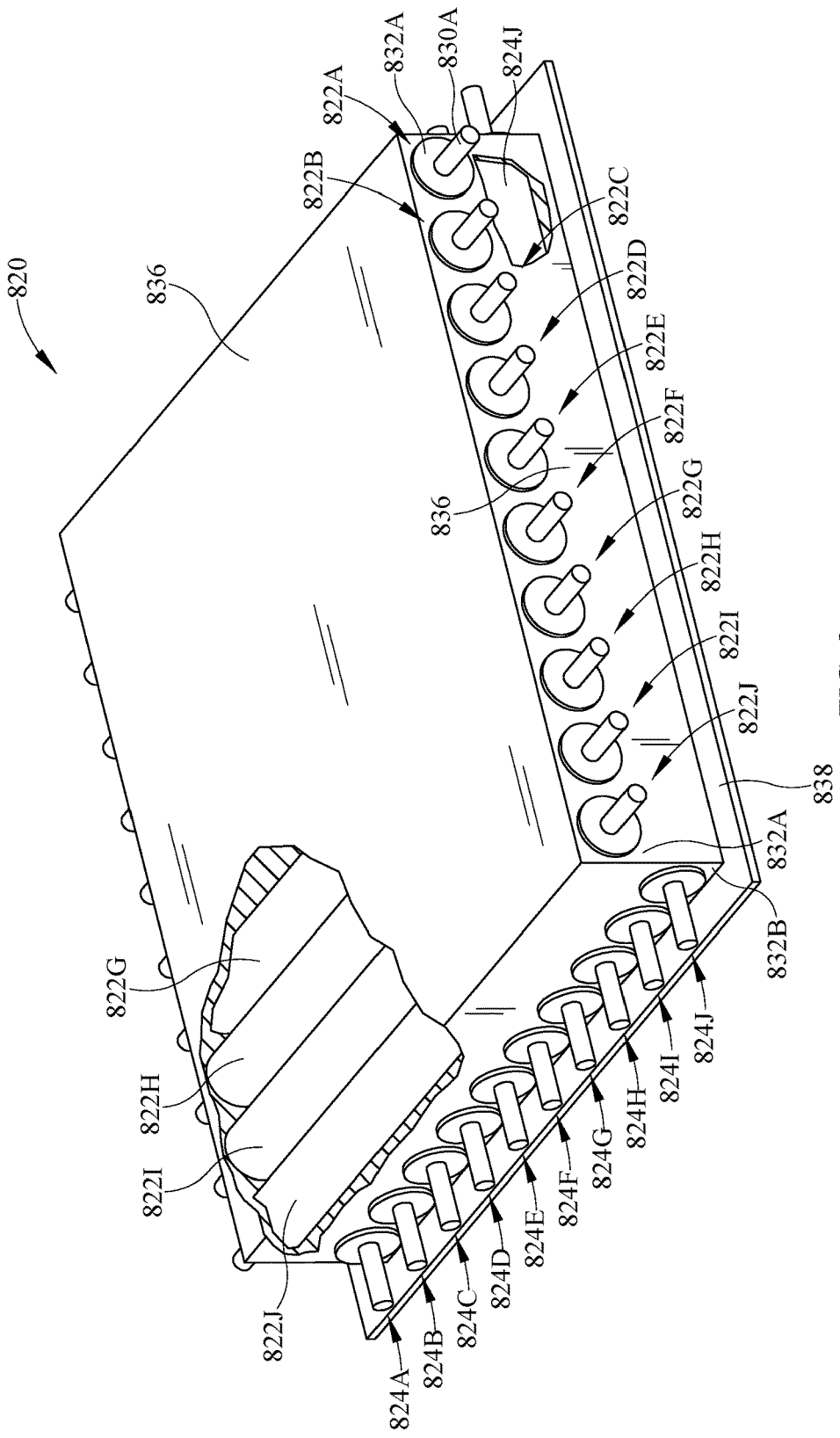
FIG. 8 illustrates a perspective view of an example array of piezoelectric strands arranged in two layers and including a conductive laminating material at least partially encapsulating the piezoelectric strands and coupled to a ground plate.
Figure 9A:
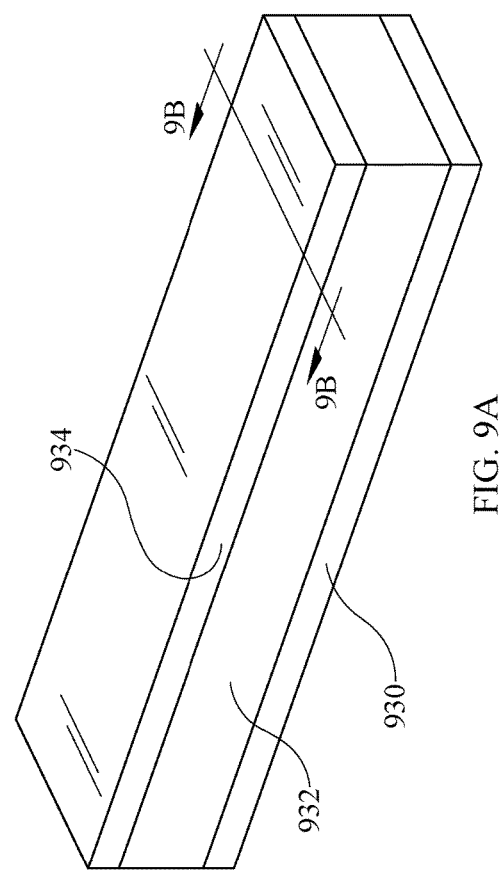
FIG. 9A illustrates a perspective view of another example piezoelectric strand that may be utilized in various implementations.
Figure 9B:
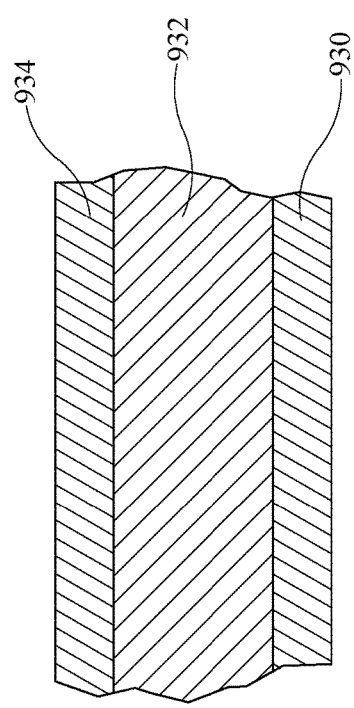
FIG. 9B illustrates a section view of the example piezoelectric strand of FIG. 9A, taken along the section line 9B-9B of FIG. 9A.

Although a specific piezoelectric strand is illustrated in FIG. 3, variations are possible. For example, an insulating layer may be provided in the coaxial arrangement and further surround the outer conductive electrode 134B, an insulating layer may surround a plurality of strands of an array, and/or an insulating layer may be interposed between layers of strands. Also, for example, as illustrated in FIG. 8 and described herein, in some implementations the outer conductive electrode 134 may be omitted. Also, for example, as illustrated in FIGS. 9A and 9B and described herein, in some implementations the materials of a piezoelectric strand may not be provided in a coaxial arrangement.

Referring again to FIG. 1, in some implementations the piezoelectric strands 122A-E of the array 120 are driving strands. As described herein, the driving piezoelectric strands 122A-E may receive, in sequence, electrical output provided by one or more electronic drivers. By virtue of the piezoelectric properties of the driving piezoelectric strands 122A-E, application of electrical output to an electrode of a piezoelectric strand generates a mechanical reaction by the piezoelectric material of the piezoelectric strand. The electrical output provided by the electronic driver(s) could be, for example, DC, AC sinusoidal, and/or triangular low frequency wave forms.

In some implementations, the piezoelectric strands 124A-E of the array 120 are sensing strands. By virtue of the piezoelectric properties of the piezoelectric strands 124A-E, application of mechanical force to the piezoelectric material of a piezoelectric strand causes the piezoelectric material to generate a piezoelectric electrical output. As described herein, when one of the driving piezoelectric strands 122A-E generates a mechanical impulse in response to electrical output applied to it, that mechanical impulse is translated to each of the sensing piezoelectric strands 124A-E at the intersection areas where that driving piezoelectric strand intersects and abuts the sensing piezoelectric strands 124A-E. The resulting mechanical stress on the sensing piezoelectric strands 124A-E causes those piezoelectric strands to each generate a corresponding piezoelectric electrical output. Notably, the piezoelectric electrical output generated by a given sensing piezoelectric strand in response to a mechanical impulse of a given driving piezoelectric strand will be dependent on external force (if any) applied at or near the intersection area where the sensing piezoelectric strand and the driving piezoelectric strand intersect. In other words, the degree of mechanical coupling between the two piezoelectric strands at an intersection area will depend on the external force (if any) that is pushing those two piezoelectric strands together at the intersection area.

The piezoelectric electrical outputs generated by the sensing piezoelectric strands 124A-E may be sensed by one or more sensors coupled to the sensing piezoelectric strands 124A-E. Each of the piezoelectric electrical outputs sensed by the sensor(s) can be mapped to a given intersection area where one of the driving strands 122A-E and one of the sensing piezoelectric strands 124A-E intersects. Accordingly, each of the piezoelectric electrical outputs sensed by the sensor(s) will provide an indication of one or more properties of external force (if any) applied at the given intersection area that maps to the sensed piezoelectric electrical output. For example, a piezoelectric output may provide an indication of whether external force is being applied at the given intersection area, a measure of the applied force, and/or a material property of an object applying the force.

Through analysis of the piezoelectric electrical output sensed by the sensor(s) in response to sequential application of the electrical output of each of the driving strands, it can be determined whether external force is being applied at each of the intersection areas—and a measure of the external force at each of the intersection areas can also be determined. This can be useful in many contexts, such as robotics. For example, in the robotics context an array of piezoelectric strands can be overlaid on an end effector to enable determination of what portions of the end effector are being affected by external force(s), the degree of the external force(s), etc. This may be beneficial to achieve desired contact between the end effector and an object, to determine the texture of the object, and/or for other purposes. This may be particularly beneficial in scenarios where other sensor(s) of the robot (e.g., a camera) may not be able to effectively sense the object (e.g., due to being "blocked" by the end effector).

Figure 4:
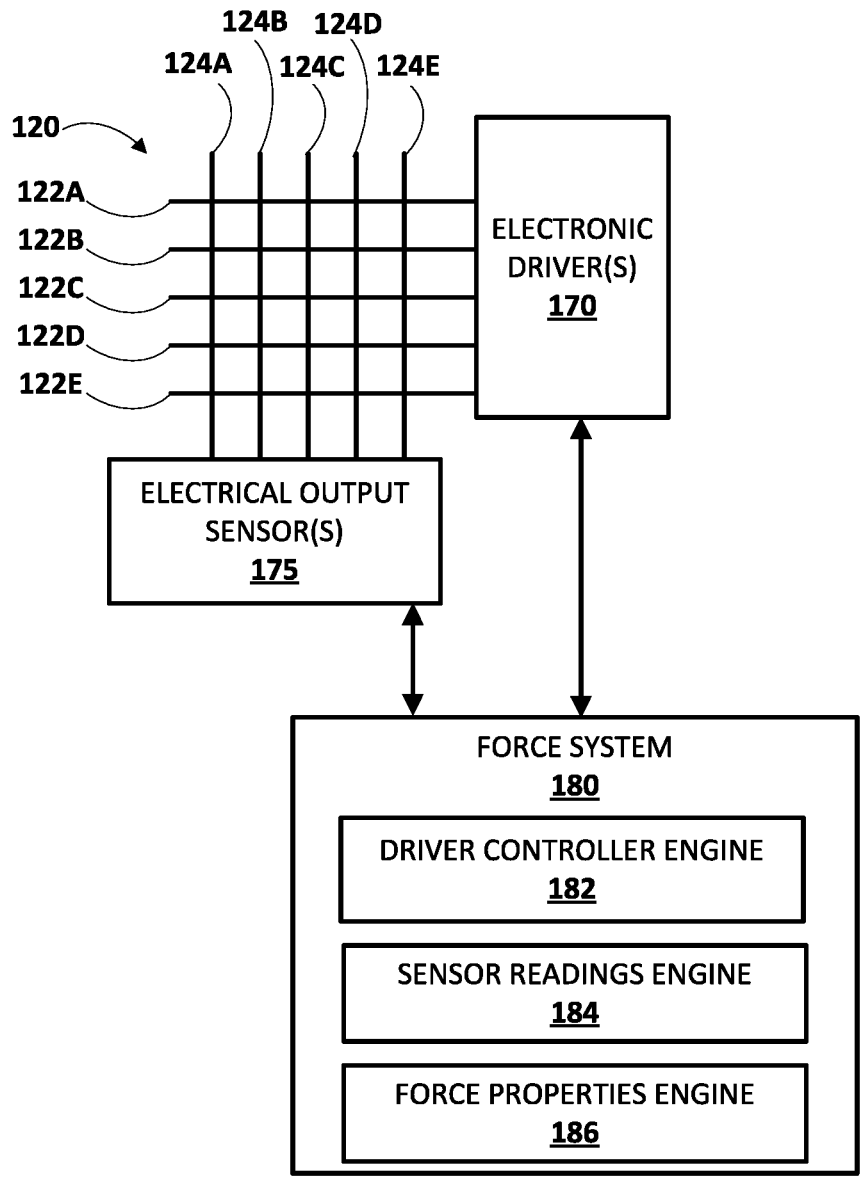
FIG. 4 illustrates a schematic view showing the example array of piezoelectric strands of FIG. 1 and example electronic driver(s) and sensor(s) that may be coupled to the array.

Referring to FIG. 4, the example array 120 of FIG. 1 is schematically illustrated. Also illustrated are one or more electronic drivers 170 coupled to the driving piezoelectric strands 122A-E of the array 120, one or more electrical output sensors 175 coupled to the sensing piezoelectric strands 124A-E of the array 120, and a force system 180 in communication with the electronic drivers 170 and the electrical output sensors 175. In some implementations, the electronic drivers 170 may be coupled to one or more of the conductive electrodes of the driving piezoelectric strands 122A-E and the electrical output sensors 175 may be coupled to one or more of the conductive electrodes of the sensing piezoelectric strands 124A-E. In some of those implementations, the electronic drivers 170 are coupled to the inner conductive electrodes of the driving piezoelectric strands 122A-E and outer conductive electrodes of the driving piezoelectric strands 122A-E are coupled to ground. In some of those implementations, the electrical output sensors 175 are coupled to the inner conductive electrodes of the sensing piezoelectric strands 124A-E and outer conductive electrodes of the sensing piezoelectric strands 124A-E are coupled to ground.

The one or more electronic drivers 170 apply electrical output to the driving piezoelectric strands 122A-E one at a time in sequence. For example, the electronic drivers 170 may apply electrical output to piezoelectric strand 122A, then 122B, then 122C, then 122D, then 122D, then repeat (optionally with the same sequence). Also, for example, the drivers 170 may apply electrical output to piezoelectric strand 122A, then 122C, then 122B, then 122E, then 122E, then repeat (optionally with the same sequence). In some implementations, the one or more electronic drivers 170 may be a single electronic driver whose electrical output is switched between the driving piezoelectric strands 122A-E in sequence to selectively apply electrical output to the driving piezoelectric strands 122A-E. In some other implementations, the one or more electronic drivers 170 may be multiple electronic drivers, where each of the electronic drivers selectively applies electrical output to one or more of the driving piezoelectric strands 122A-E.

The driver controller engine 182 of the force system 180 may control the one or more electronic drivers 170. Control of the electronic drivers 170 may include, for example, control of whether the electronic drivers 170 provide any electrical output, control of one or more properties of the electrical output (e.g., frequency or frequencies, voltage, amplitude, wave form), control of which of the driving piezoelectric strands 122A-E the electronic drivers 170 provides electrical output to, and/or control of the sequence and/or timing associated with providing the electrical output to the driving piezoelectric strands 122A-E. For example, the electronic drivers 170 may be a single electronic driver and the driver controller engine 182 may cause actuation of one or more switches to sequentially switch electrical output of the single electronic driver between the driving piezoelectric strands 122A-E.

In some implementations, one or more (e.g., all) aspects of the driver controller engine 182 may be implemented by one or more components (e.g., processor or other controller) that are packaged with other components of the one or more electronic drivers 170. In some implementations, one or more (e.g., all) aspects of the driver controller engine 182 may be implemented by one or more components that are separate from other components of the one or more electronic drivers 170. For example, the driver controller engine 182 may be implemented by a separate processor or other controller, such as one or more processors of a robot that may optionally control one or more other components of the robot.

The one or more electrical output sensors 175 receive piezoelectric electrical output (if any) generated by each the sensing piezoelectric strands 124A-E in response to mechanical stress applied to the strands 124A-E by the mechanical reactions of the driving piezoelectric strands 122A-E (that occurs responsive to the application of electrical output by the electronic drivers 170). For example, when electrical output is applied to the driving piezoelectric strand 122A, it will have a mechanical reaction that applies mechanical stress to each of the strands 124A-E. In response to the mechanical stress, each of the strands 124A-E may generate a corresponding piezoelectric electrical output, and those outputs are sensed by the one or more electrical output sensors 175. Likewise, when electrical output is applied to the driving piezoelectric strand 122B, it will have a mechanical reaction that applies mechanical stress to each of the strands 124A-E—and in response to the mechanical stress, each of the strands 124A-E may generate a corresponding piezoelectric electrical output, and those outputs are sensed by the one or more electrical output sensors 175. Again, the piezoelectric electrical output produced by a given sensing piezoelectric strand in response to a mechanical impulse of a given driving piezoelectric strand will be dependent on external force (if any) applied at or near the intersection area where the given sensing piezoelectric strand and the given driving piezoelectric strand intersect.

In some implementations, the one or more electrical output sensors 175 may be a single receiver with connections to the sensing piezoelectric strands 124A-E and that scans those connections in sequence to receive the piezoelectric electrical output generated by each the sensing piezoelectric strands 124A-E. In some implementations, the one or more electrical output sensors 175 may be multiple sensors, where each of the sensors receives piezoelectric electrical output from one or more of the sensing piezoelectric strands 124A-E.

The sensor readings engine 184 of the force system 180 may control the one or more electrical output sensors 175 and/or may map received piezoelectric electrical outputs to their corresponding intersection areas. Control of the electrical output sensors 175 may include, for example, control of the sequence and/or timing associated with sensing of the sensing piezoelectric strands 124A-E. Mapping of received piezoelectric electrical outputs to their corresponding intersection areas may include, for example, determining, for a given received piezoelectric electrical output, which sensing piezoelectric strand 124A-E generated the piezoelectric electrical output and determining which driving piezoelectric strand 122A-E received electrical output from the electronic drivers 170 to cause the generation of the piezoelectric electrical output. The sensor readings engine 184 may buffer or otherwise store (e.g., in associated memory) piezoelectric electrical outputs and their corresponding intersection areas for analysis by force properties engine 186. In some implementations, the sensor readings engine 184 and the driver controller engine 182 are in communication and/or synched to a common clock to facilitate control of sequencing and/or timing, the mapping of received piezoelectric electrical outputs to their corresponding intersection areas, etc.

In some implementations, one or more (e.g., all) aspects of the driver controller engine 182 and the sensor readings engine 184 may be combined. In some implementations, one or more (e.g., all) aspects of the sensor readings engine 184 may be implemented by one or more components (e.g., processor or other controller) that are packaged with other components of the one or more electrical output sensors 175. In some implementations, one or more (e.g., all) aspects of the sensor readings engine 184 may be implemented by one or more components that are separate from other components of the one or more electrical output sensors 175. For example, the sensor readings engine 184 may be implemented by a separate processor or other controller, such as one or more processors of a robot that may optionally control one or more other components of the robot.

The force properties engine 186 determines one or more properties of external force(s) (if any) applied to the array 120 for a given time period based on analysis of the piezoelectric electrical outputs sensed by the sensor(s) in response to sequential application of the electrical output of each of the driving strands during that time period. For example, the force properties engine 186 may determine one or more properties of external force(s) applied to the array 120 during a time period based on a group of the piezoelectric electrical outputs received during a single iteration of sequentially applying electrical output to the driving strands 122A-E during that time period. For example, a group of twenty five piezoelectric electrical outputs (one for each intersection area) may be received during a single iteration of sequentially applying electrical output to the driving strands 122A-E. The force properties engine 186 may determine one or more properties of external force(s) applied to the array 120 during that iteration based on the received piezoelectric electrical outputs.

In some implementations, the force properties engine 186 determines one or more properties of external force(s) applied to the array 120 based on comparing each of the piezoelectric electrical outputs of a group to one or more reference electrical outputs. For example, the force properties engine 186 may determine whether any force is being applied at each of the plurality of intersection areas based on comparing the piezoelectric electrical output at each of the intersection areas to one or more reference electrical outputs (a general reference, or multiple references each mapped to a corresponding one of the intersection areas). In some implementations, the one or more reference electrical outputs may each be indicative of anticipated piezoelectric electrical output of a corresponding sensing piezoelectric strand when a given electrical output is applied to a corresponding driving piezoelectric strand and no force is being applied at or near the intersection area of the sensing and driving piezoelectric strands. In some implementations, the one or more reference electrical outputs may be pre-loaded into memory and/or may be based on actual piezoelectric electrical outputs received during a calibration procedure (e.g., when no force is being applied to the array 120).

As one example, a group of twenty five piezoelectric electrical outputs (one for each intersection area) may be received during a single iteration of sequentially applying electrical output to the driving strands 122A-E. The force properties engine 186 may compare each of the twenty five piezoelectric electrical outputs to a reference electrical output and, if a piezoelectric electrical output exceeds the reference electrical output and/or exceeds it by at least a threshold amount, the force properties engine 186 may determine that force is being applied at the intersection area that maps to that piezoelectric electrical output. Accordingly, the force properties engine 186 may determine which of the intersection areas have force being applied and/or which of the intersection areas do not have force being applied.

As another example of force properties engine 186 determining one or more properties of external force(s) applied to the array 120, the force properties engine 186 may additionally and/or alternatively determine a measure of the force being applied at each of one or more of the intersection areas. In some implementations, the force properties engine 186 may determine the measure of the force for a given intersection area based on comparing the piezoelectric electrical output mapped to the given intersection area to one or more reference electrical outputs, based on a mapping of piezoelectric electrical outputs to measures of force, a mathematical formula, and/or based on other technique(s). For instance, the force properties engine 186 may access a mapping (e.g., in associated memory) of piezoelectric electrical outputs to corresponding measures of force and determine a measure of force for the given intersection area that maps to the piezoelectric electrical output of the given intersection area. Also, for instance, the force properties engine 186 may compare the piezoelectric electrical output at the given intersection area to one or more reference electrical outputs and determine the measure of force based on a magnitude of the difference between the piezoelectric electrical output at the given intersection area and the one or more reference electrical outputs.

As one example, a piezoelectric electrical output that corresponds to an intersection area may be received during a single iteration of sequentially applying electrical output to the driving strands 122A-E. The force properties engine 186 may determine that the received electrical output is within a range of piezoelectric electrical outputs that map to a force of 0.5 newton. Based on the mapping, the force properties engine 186 may determine the force being applied at the intersection area during the single iteration is 0.5 newton.

As another example of force properties engine 186 determining one or more properties of external force(s) applied to the array 120, the force properties engine 186 may additionally and/or alternatively determine a material property for each of one or more object(s) applying force at each of one or more of the intersection areas. For instance, in some implementations, in applying the electrical output sequentially to the driving piezoelectric strands 122A-E, the one or more electronic drivers 170 may vary a frequency of the electrical output during the applying to each of the driving piezoelectric strands 122A-E, thereby varying the mechanical reaction of the driving piezoelectric strands 122A-E over the applying (the mechanical reaction of the piezoelectric material may be dependent on the frequency of applied electrical output). For example, during a given iteration of applying electrical output sequentially to the driving piezoelectric strands 122A-E, the electronic drivers 170 may apply, to the driving piezoelectric strand 122A, electrical output at a frequency of 250 KHz, followed by electrical output at a frequency of 300 KHz, followed by electrical output at a frequency of 350 KHz, etc. During the same iteration, the electronic drivers 170 may likewise vary the frequency of the electrical output during the sequential application to each of the remaining driving piezoelectric strands 122A-E.

At one or more of the frequencies of the varying electrical output, objects that are applying force to the array 120 will react differently (e.g., have a different amount of "give") to the corresponding mechanical reactions of the driving strands 122A-E at the intersection areas where those objects are applying force, depending on the material construct of the objects. For example, a rubber object may react differently than a steel object. As a result of the different responses by the different objects, the mechanical stress applied to the corresponding sensing piezoelectric strands at the intersection areas where an object is applying force will be different at different frequencies and will depend on the material construct of the object that is applying force. Resultantly, the piezoelectric electrical output generated by the corresponding sensing piezoelectric strands will be different at the different frequencies and will also depend on the material construct of the object.

The force properties engine 186 may determine a material property of an object applying force at a given intersection area based on variances in the piezoelectric electrical output that maps to the given intersection area. For example, the force properties engine 186 may compare variances in the piezoelectric electrical output for a given intersection area to known variances for different materials, and the material corresponding to the most closely matching variances may be determined to be the material of the object applying force to the intersection area.

As one example, a piezoelectric electrical output that corresponds to an intersection area may be received during a single iteration of sequentially applying electrical output to the driving strands 122A-E. The piezoelectric electrical output corresponding to the intersection area may vary as a result of varying electrical output provided to a corresponding driving piezoelectric strand during the single iteration of sequentially applying electrical output, as described herein. The force properties engine 186 may compare one or more properties of the varying received electrical output to one or more properties for variances of different materials and select one or more of the materials whose properties most closely match the properties of the varying received electrical output. For example, the force properties engine 186 may compare the amplitude variation, the frequency variation, and/or other properties of the varying received electrical output to one or more properties for variances of metal, wood, rubber, and/or other materials. The force properties engine 186 may select one or more of those materials as the material of the object applying force at the intersection area, based on the properties for those materials most closely matching the properties of the varying received electrical output.

Although some examples provided with respect to FIG. 4 and elsewhere herein are described with respect to a single iteration of sequentially applying electrical output to the driving strands 122A-E and receiving corresponding piezoelectric electrical output in response to the single iteration, it is understood that multiple iterations may be performed at a relatively high frequency. For example, multiple iterations may be performed (e.g., periodically or continuously) over the course of a second, and at each iteration electrical output may be sequentially applied to the driving strands 122A-E and corresponding piezoelectric electrical output received. Determinations made by force properties engine 186 may be updated at each iteration, and may optionally be based on received piezoelectric electrical output from one or more prior iterations. Additional iterations may be performed (e.g., continuously) over the course of the following seconds, minutes, hours, etc. In some implementations, one or more (e.g., all) aspects of the force properties engine 186 may be implemented by a processor or other controller, such as one or more processors of a robot that may optionally control one or more other components of the robot.

Also, although some specific examples of electronic drivers and electrical output sensors, and their connections to an array of piezoelectric strands are illustrated and described with respect to FIG. 4, variations are possible. As one example, in some implementations one or more techniques may be utilized to reduce the number of connections to the one or more electronic drivers 170 that are needed to apply electrical output to the driving piezoelectric strands 122A-E and/or to reduce the number of connections to the one or more electrical output sensors 175 that are needed to sense piezoelectric electrical output of the sensing piezoelectric strands 124A-E. For example, transistors and/or other components may be functionally interposed between electrical output provided by the one or more electronic drivers 170 and one or more driving piezoelectric strands 122A-E, and may be selectively actuated to route the electrical output at a desired sequence with a desired timing. Also, for example, transistors and/or other components may be functionally interposed between the one or more electrical output sensors 175 and the sensing piezoelectric strands 124A-E, and may be selectively actuated to route the piezoelectric electrical output at a desired sequence with a desired timing. For instance, flexible organic transistors on a flexible substrate may be distributed along the edges of the array 120 and selectively driven using a serial protocol to achieve a desired sequence and/or timing of connections between the array 120 and the one or more electronic drivers 170 and the one or more electrical output sensors 175. One or more of the transistors and/or other components may be associated with both the electrical output sensors 175 and the electronic drivers 170 and/or may be actuated in unison in response to a common control scheme.

Figure 5:
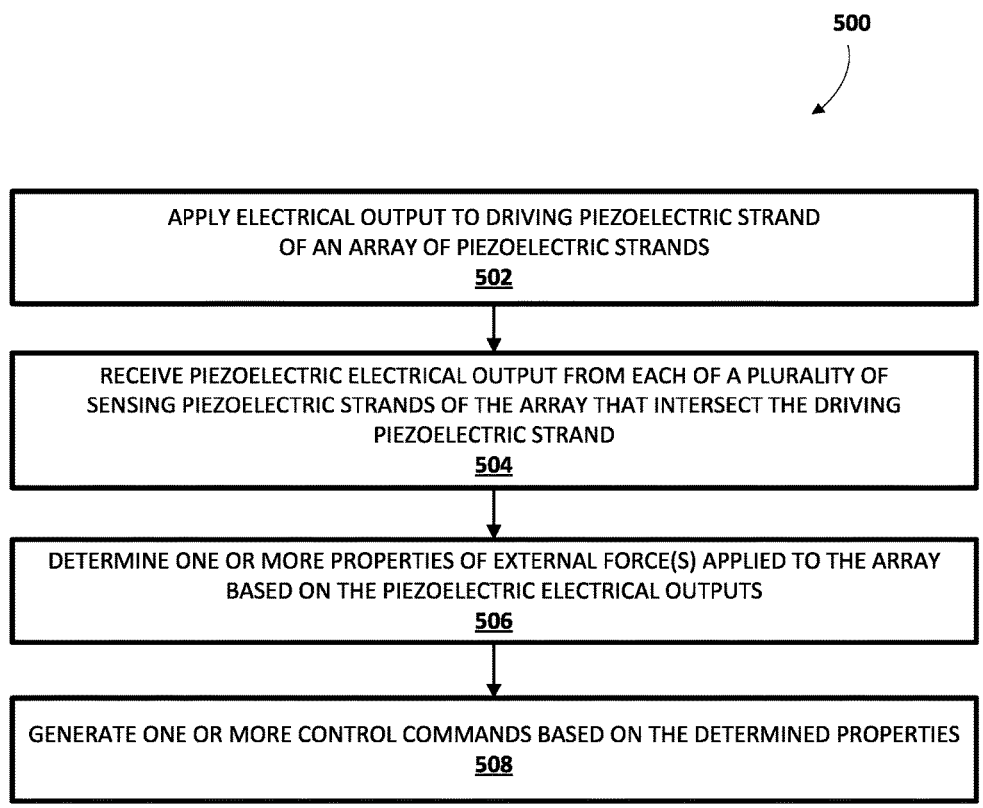
FIG. 5 illustrates a flow chart of an example method of applying an electrical output to a piezoelectric strand of an array of piezoelectric strands, receiving corresponding piezoelectric electrical output generated by each of a plurality of intersecting piezoelectric strands of the array that each intersect the piezoelectric strand, and determining one or more properties of external force(s) applied to the array based at least in part on the corresponding piezoelectric electrical outputs.

Referring to FIG. 5, an example method 500 of applying an electrical output to a piezoelectric strand of an array of piezoelectric strands, receiving corresponding piezoelectric electrical output generated by each of a plurality of intersecting piezoelectric strands of the array that each intersect the piezoelectric strand, and determining one or more properties of external force(s) applied to the array based at least in part on the corresponding piezoelectric electrical outputs is illustrated. Other implementations may perform the steps of FIG. 5 in a different order, omit certain steps, and/or perform different and/or additional steps than those illustrated in FIG. 5. For convenience, aspects of FIG. 5 will be described with reference to a system of one or more components that may perform the method. In some implementations, the system may include one or more components of FIG. 4, such as electronic drivers 170, electrical output sensors 175, and/or force system 180.

At block 502, the system applies electrical output to a driving piezoelectric strand of an array of piezoelectric strands. For example, an electronic driver may apply electrical output to the driving piezoelectric strand. In some implementations, the electrical output may be an electrical output whose frequency is varied during the applying.

At block 504, the system receives piezoelectric electrical output from each of a plurality of sensing piezoelectric strands of the array that intersect the driving piezoelectric strand. For example, one or more electrical output sensors may receive the electrical output from each of the sensing piezoelectric strands. The piezoelectric electrical outputs are generated by the piezoelectric strands in response to the application of the electrical output to the driving piezoelectric strand at block 502. For example, the driving piezoelectric strand will have a mechanical reaction in response to the electrical output applied at block 502 and that mechanical reaction will apply mechanical stress to each of sensing piezoelectric strands. In response to the mechanical stress, each of the sensing piezoelectric strands generates a corresponding piezoelectric electrical output that will be dependent on external force (if any) applied at or near a corresponding intersection area where the corresponding sensing piezoelectric strand and the driving piezoelectric strand intersect.

At block 506, the system determines one or more properties of external force(s) applied to the array based on the piezoelectric electrical outputs. For example, the system may determine which of a plurality of intersection areas mapped to the piezoelectric electrical outputs received at block 504 have force being applied and/or which of the intersection areas do not have force being applied. Also, for example, the system may additionally and/or alternatively determine a measure of the force being applied at each of one or more of the intersection areas and/or a material property for each of one or more object(s) applying force at each of one or more of the intersection areas. In some implementations, the system may determine one or more of the properties based on comparing the piezoelectric electrical output mapped to the given intersection area to one or more reference electrical outputs, based on a mapping of piezoelectric electrical outputs to one or more of the properties, a mathematical formula, and/or based on other technique(s).

At block 508, the system generates one or more control commands based on the determined properties. For example, the system may utilize one or more of the determined properties as a form of sensor feedback and may generate one or more control commands to control one or more actuators and/or other components based on the sensor feedback. For instance, in some implementations the array may be installed on an end effector or other component of a robot. In some of those implementations, one or more processors or other controller(s) of the robot may generate one or more control commands based on the determined properties. For example, they may generate control commands that when provided to one or more actuators of the robot cause the amount of force being applied to an object by end effector to increase or decrease, cause the position of the end effector to be adjusted, etc. For instance, the control commands may be generated to achieve a desired measure of force for contact between the robotic component and another object, to achieve a desired coverage area for contact between the robotic component and the other object, etc. In some implementations, block 508 may be omitted.

Figure 6:
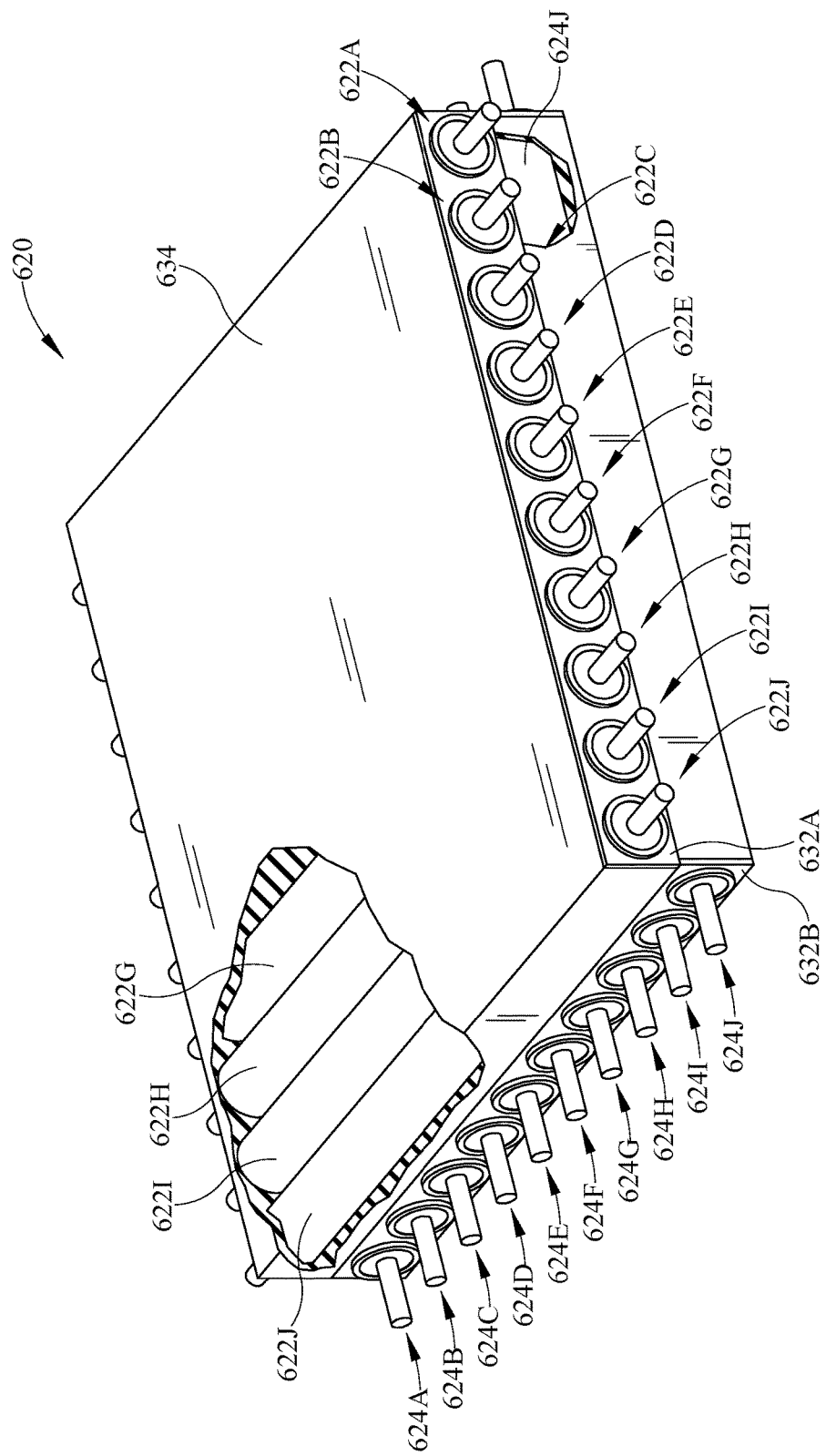
FIG. 6 illustrates a perspective view of an example array of piezoelectric strands arranged in two layers and including a non-conductive laminating material at least partially encapsulating the piezoelectric strands.
Figure 7:
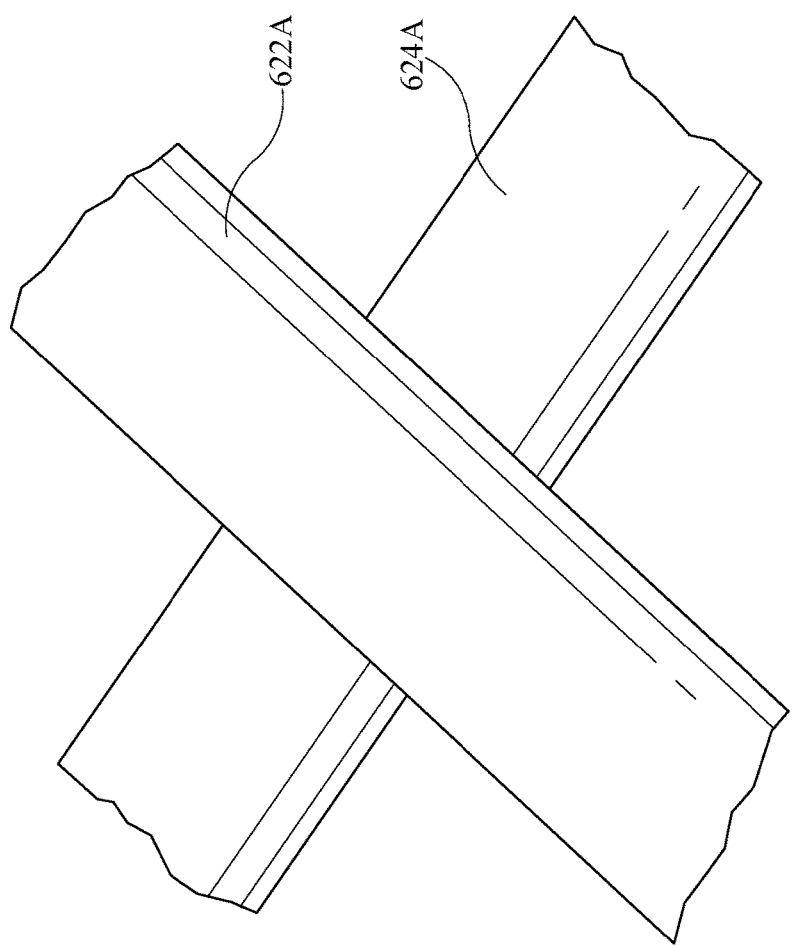
FIG. 7 illustrates a close-up view of one of the intersection areas of the array of FIG. 6, with other structure of the array of FIG. 6 removed.

FIG. 6 illustrates a perspective view of an example array 620 of piezoelectric strands 622A-J and 624A-J. In some implementations, the piezoelectric strands 622A-J and 624A-J may have the same and/or a similar construction as piezoelectric strand 122B of FIG. 3. The piezoelectric strands are arranged in two layers, with one layer being piezoelectric strands 622A-J and the other layer being piezoelectric strands 624A-J. The piezoelectric strands 622A-J and 624A-J are each linearly extending, and the piezoelectric strands 622A-E are arranged orthogonal to the piezoelectric strands 624A-J. The piezoelectric strands 622A-J and 624A-J intersect and abut one another at a plurality of intersection areas. For example, piezoelectric strand 622A intersects and abuts each of piezoelectric strands 624A-J at a corresponding intersection area. In some implementations, a portion of non-conductive material 634 and/or other material may optionally be interposed between the piezoelectric strands 622A-J and the piezoelectric strands 624A-J (e.g., a "sheet" between the two layers). In FIG. 7, a close up view of the intersection area where piezoelectric strands 622A and 624B intersect and abut is illustrated. In FIG. 7, other structure (e.g., non-conductive laminating material 634) has been removed for clarity.

In FIG. 6, the non-conductive laminating material 634 at least partially encapsulates the piezoelectric strands 622A-J and 624A-J and may retain the positioning of the piezoelectric strands 622A-J and 624A-J relative to one another and/or may electrically insulate each of the piezoelectric strands 622A-J and 624A-J. The non-conductive laminating material 634 may be flexible and/or thin enough so as to enable external forces to be translated to the piezoelectric strands 622A-J and/or 624A-J and/or mechanical reactions of the piezoelectric strands 622A-J and/or 624A-J to be translated between one another. It is noted that in FIG. 6, two separate portions of the non-conductive laminating material 634 are illustrated cut-away. In particular, a first portion is cut-away to show the piezoelectric strands 622G-J within the non-conductive laminating material 634 and their interface with the laminating material 634. A second portion is cut-away to show the piezoelectric strand 624J within the non-conductive laminating material 634 and its interface with the laminating material 634.

The array 620 also includes conductive layers 632A and 632B on an exterior surface of non-conductive laminating material 634. Conductive layer 632A is electrically coupled to the outer conductive electrodes of piezoelectric strands 622A-J and conductive layer 632B is electrically coupled to the outer conductive electrodes of piezoelectric strands 624A-J. The conductive layers 632A and 632B may optionally be electrically coupled to ground and/or optionally electrically coupled to one another.

In some implementations, the piezoelectric strands 622A-J of the array 620 are driving strands and the piezoelectric strands 624A-J are sensing strands. As with array 120 of FIG. 1, the driving piezoelectric strands 622A-J may receive, in sequence, electrical output provided by one or more electronic drivers and by virtue of the piezoelectric properties of the driving piezoelectric strands 622A-J, application of electrical output to an electrode of a piezoelectric strand generates a mechanical reaction by the piezoelectric material of the piezoelectric strand. By virtue of the piezoelectric properties of the sensing piezoelectric strands 624A-J, application of mechanical force to the piezoelectric material of a piezoelectric strand causes the piezoelectric material to generate a piezoelectric electrical output. When one of the driving piezoelectric strands 622A-J generates a mechanical impulse in response to electrical output applied to it, that mechanical impulse is translated to each of the sensing piezoelectric strands 624A-J at the intersection areas where that driving piezoelectric strand intersects and abuts the sensing piezoelectric strands 624A-J. The resulting mechanical stress on the sensing piezoelectric strands 624A-J causes those piezoelectric strands to each generate a corresponding piezoelectric electrical output that is dependent on external force (if any) applied at or near the intersection area where the sensing piezoelectric strand and the driving piezoelectric strand intersect.

FIG. 8 illustrates a perspective view of an example array 820 of piezoelectric strands 822A-J and 824A-J. In some implementations, the piezoelectric strands 822A-J and 824A-J may have the same and/or a similar construction as piezoelectric strand 122B of FIG. 3, but they do not include any outer conductive layer. The piezoelectric strands are arranged in two layers, with one layer being piezoelectric strands 822A-J and the other layer being piezoelectric strands 824A-J. The piezoelectric strands 822A-J and 824A-J are each linearly extending, and the piezoelectric strands 822A-J are arranged orthogonal to the piezoelectric strands 824A-E. The piezoelectric strands 822A-J and 824A-J intersect and abut one another at a plurality of intersection areas. For example, piezoelectric strand 822A intersects and abuts each of piezoelectric strands 824A-J at a corresponding intersection area.

In FIG. 8, a conductive laminating material 836 at least partially encapsulates the piezoelectric strands 822A-J and 824A-J and may retain the positioning of the piezoelectric strands 822A-J and 824A-J relative to one another and/or may obviate the need for an outer conductive electrode around each of the piezoelectric strands 822A-J and 824A-J. The conductive laminating material may be flexible and/or thin enough so as to enable external forces to be translated to the piezoelectric strands 822A-J and/or 824A-J and/or mechanical reactions of the piezoelectric strands 822A-J and/or 824A-J to be translated between one another. The array 820 also includes a ground plate 838 that is coupled to the conductive material 836 and that may also optionally be electrically coupled to ground. It is noted that in FIG. 8, two separate portions of the conductive laminating material 836 are illustrated cut-away. In particular, a first portion is cut-away to show the piezoelectric strands 822G-J within the conductive laminating material 836 and their interface with the laminating material 836. A second portion is cut-away to show the piezoelectric strand 824J within the conductive laminating material 836 and its interface with the laminating material 836.

As with array 120 of FIG. 1 and array 620 of FIG. 6, the driving piezoelectric strands 822A-J may receive, in sequence, electrical output provided by one or more electronic drivers and by virtue of the piezoelectric properties of the driving piezoelectric strands 822A-J, application of electrical output to an electrode of a piezoelectric strand generates a mechanical reaction by the piezoelectric material of the piezoelectric strand. By virtue of the piezoelectric properties of the sensing piezoelectric strands 824A-J, application of mechanical force to the piezoelectric material of a piezoelectric strand causes the piezoelectric material to generate a piezoelectric electrical output. When one of the driving piezoelectric strands 822A-J generates a mechanical impulse in response to electrical output applied to it, that mechanical impulse is translated to each of the sensing piezoelectric strands 824A-J at the intersection areas where that driving piezoelectric strand intersects and abuts the sensing piezoelectric strands 824A-J. The resulting mechanical stress on the sensing piezoelectric strands 824A-J causes those piezoelectric strands to each generate a corresponding piezoelectric electrical output that is dependent on external force (if any) applied at or near the intersection area where the sensing piezoelectric strand and the driving piezoelectric strand intersect.

FIG. 9A illustrates a perspective view of another example piezoelectric strand that may be utilized in various implementations. FIG. 9B illustrates a section view of the example piezoelectric strand of FIG. 9A, taken along the section line 9B-9B of FIG. 9A. The piezoelectric strand of FIGS. 9A and/or 9B may be utilized in a woven and/or layered arrangement in lieu of and/or in addition to the coaxial arrangement and/or other arrangements.

The piezoelectric strand of FIGS. 9A and 9B includes a longitudinally extending planar lower conductive electrode 930 and a longitudinally extending planar lower conductive electrode 934 that collectively sandwich a longitudinally extending planar piezoelectric material 932. The piezoelectric material 932 induces an electrical field across its boundaries when a mechanical stress is applied to it, or vice versa (an electrical field applied across its boundaries induces a mechanical reaction). The piezoelectric material 932 may be any one of various types of piezoelectric materials (e.g., a piezoelectric polymer) and the conductive electrodes 930 and 934 may be any of various types of conductive materials. In some implementations the piezoelectric material 932 and the conductive electrodes 930 and 934 are each flexible. In some implementations, the piezoelectric material 932 may have an electric field orientation that is between the two conductive electrodes 930 and 934 and a desired mechanical strain that is in perpendicular to the electric field orientation and to the conductive electrodes 930 and 934.

Figure 10:
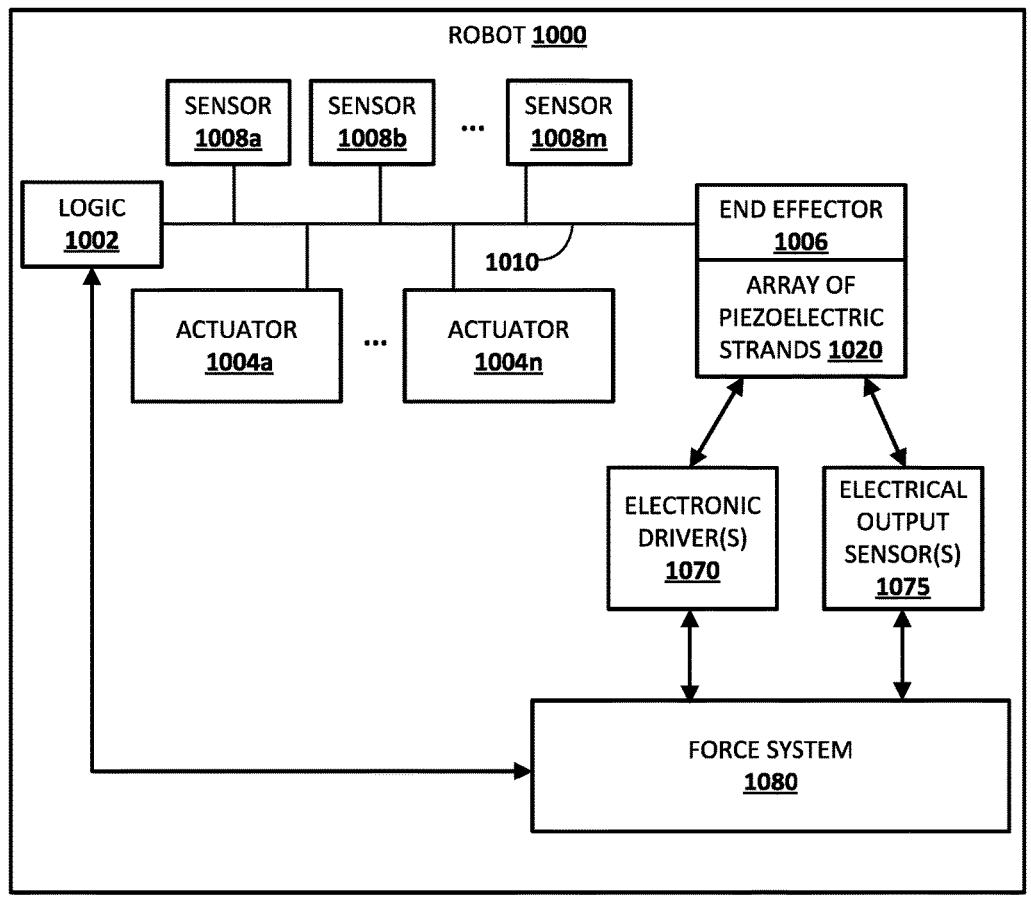
FIG. 10 illustrates an example environment in which disclosed techniques may be implemented.

FIG. 10 is a schematic diagram of an example environment in which disclosed techniques may be implemented. Robot 1000 may take various forms, including but not limited to a robot arm, a humanoid form, an animal form, a wheeled device, a submersible vehicle, an unmanned aerial vehicle ("UAV"), and so forth. In various implementations, robot 1000 may include logic 1002. Logic 1002 may take various forms, such as one or more processors, one or more field-programmable gate arrays ("FPGA"), one or more application-specific integrated circuits ("ASIC"), one or more so-called "real time controllers," and so forth.

In various implementations, logic 1002 may be operably coupled with one or more actuators 1004a-n and/or one or more sensors 1008a-m, e.g., via one or more buses 1010. Sensors 1008a-m may take various forms, including but not limited to light sensors, pressure sensors, pressure wave sensors (e.g., microphones), proximity sensors, accelerometers, gyroscopes, thermometers, barometers, and so forth. While sensors 1008a-m are depicted as being integral with robot 1000, this is not meant to be limiting. In some implementations, one or more sensors 1008a-m may be located external to robot 1000, e.g., as standalone units.

Logic 1002 may provide control commands to the actuators 1004a-n to accomplish one or more programmed tasks. Those control commands include commands that direct the actuators 1004a-n to move to traverse one or more trajectories based on input from sensors 1008a-m and/or based on input from force system 1080. One or more of the actuators 1004a-n is coupled to an end effector 1006 of the robot. The end effector 1006 may take various forms such as a gripper. An array of piezoelectric strands 1020 is overlaid on one or more parts of the end effector 1006 and is coupled to one or more electronic drivers 1070 and one or more electrical output sensors 1075. For example, the array of piezoelectric strands 1020 may be a flexible deformable array that, when placed over the end effector 1006, overlays at least portions of the end effector 1006 and substantially conforms to the exterior surface of those portions of the end effector 1006. The array of piezoelectric strands 1020 may optionally be coupled with adhesive and/or other structure to the portions of the end effector 1006 it overlays (optionally with one or more intermediary layers between the end effector 1006 and the array 1020), or may be overlaid over the end effector 1006 without coupling via another structure. In some implementations, the array of piezoelectric strands 1020 may optionally be covered by a cloth, elastomer, and/or other material for aesthetics and/or to shield the array of piezoelectric strands from moisture, debris, and/or other object(s).

The electronic drivers 1070 and electrical output sensors 1075 are in communication with force system 1080. The array of piezoelectric strands 1020, the electronic drivers 1070, the electrical output sensors 1075, and the force system 1080 may share one or more (e.g., all) aspects in common with like numbered components herein (e.g., array 120, electronic drivers 170, electrical output sensors 175, and force system 180).

The force system 1080 may control the one or more electronic drivers 1070, may control the one or more electrical output sensors 175 and/or may map piezoelectric electrical outputs received from the array 1020 to their corresponding intersection areas, and/or may determine one or more properties of external force(s) (if any) applied to the array 1020 for a given time period based on analysis of the piezoelectric electrical outputs sensed by the sensor(s) in response to sequential application of the electrical output of each of the driving strands of array 1020 during that time period.

The force system 1080 may further provide one or more of the determined properties of external force applied to the array 1020 to logic 1002. Logic 1002 may generate one or more control commands for providing to one or more of the actuators 1004a-n based at least in part on the properties of external force provided by the force system 1080. For example, the logic 1002 may generate control commands that when provided to one or more of the actuators 1004a-n cause the amount of force being applied to an object by end effector 1006 to increase or decrease, cause the position of the end effector 1006 to be adjusted, etc.

While logic 1002 and force system 1080 are depicted separately in FIG. 10, this is not meant to be limiting. In various implementations, one or more aspects of force system 1080 may be implemented in logic 1002, distributed across both logic 1002 and force system 1080, and/or distributed across other components not depicted in FIG. 10.

While several implementations have been described and illustrated herein, a variety of other means and/or structures for performing the function and/or obtaining the results and/or one or more of the advantages described herein may be utilized, and each of such variations and/or modifications is deemed to be within the scope of the implementations described herein. More generally, all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific implementations described herein. It is, therefore, to be understood that the foregoing implementations are presented by way of example only and that, within the scope of the appended claims and equivalents thereto, implementations may be practiced otherwise than as specifically described and claimed. Implementations of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

What is claimed is:

1. An apparatus, comprising:
a plurality of strands arranged in a first group and a second group, the strands of the first group and the strands of the second group intersecting at a plurality of intersection areas;
wherein each of the strands comprises a longitudinally extending piezoelectric material and a longitudinally extending conductive electrode;

at least one electronic driver electronically coupled to the strands of the first group and applying varying frequency driver electrical outputs selectively to the conductive electrodes of the strands of the first group;

at least one sensor electronically coupled to the conductive electrodes of the strands of the second group and sensing varying piezoelectric electrical outputs generated by the piezoelectric material of the strands of the second group;

wherein the piezoelectric material of each of the strands of the first group has a varying mechanical reaction in response to application of a corresponding one of the varying frequency driver electrical outputs to the conductive electrode of the strand;

wherein each of a plurality of the varying piezoelectric electrical outputs is generated by the piezoelectric material of a corresponding strand of the strands of the second group in response to mechanical stress applied to the corresponding strand by the varying mechanical reaction of one of the strands of the first group; and at least one processor that determines, based on the varying piezoelectric electrical outputs for a given strand of the strands of the second group, a material of an object applying force at an intersection of the given strand and an additional strand of the strands of the first group, wherein determining the material of the object applying force at the intersection is based on one or more variances in the varying piezoelectric outputs for the given strand.

2. The apparatus of claim 1, wherein the strands of the first group are interwoven with the strands of the second group.

3. The apparatus of claim 1, wherein the strands of the first group are in a first layer and the strands of the second group are in a second layer.

4. The apparatus of claim 3, wherein the intersecting at the plurality of intersection areas is a right angle intersection at each of the intersection areas.

5. The apparatus of claim 3, further comprising a laminating material at least partially encapsulating all of the strands of the first group and the second group.

6. The apparatus of claim 5, wherein the laminating material is conductive.

7. The apparatus of claim 5, wherein the laminating material is non-conductive.

8. The apparatus of claim 7, further comprising a conductive material contacting all of the strands of the first group and all of the strands of the second group.

9. The apparatus of claim 1, wherein the strands of the first group and the strands of the second group are abutting at the plurality of intersection areas.

10. The apparatus of claim 9, wherein the abutting at the plurality of intersection areas is a contacting abutment at each of the intersection areas when no external force is applied to the apparatus and when no electrical output is provided by the electronic driver.

11. The apparatus of claim 1, wherein the conductive electrode of the given strand forms a core of the given strand, and wherein the piezoelectric material of the given particular strand immediately surrounds the conductive electrode.

12. The apparatus of claim 11, wherein the given strand further comprises a longitudinally extending additional conductive electrode that immediately surrounds the piezoelectric material of each of the strands.

13. The apparatus of claim 12, wherein the given strand further comprises an electrically insulating layer surrounding the additional conductive electrode.

14. A method, comprising:
applying an electrical output to a piezoelectric strand that intersects each of a plurality of intersecting piezoelectric strands at a corresponding intersection area, wherein applying the electrical output generates a mechanical reaction by the piezoelectric strand, and wherein applying the electrical output to the piezoelectric strand comprises varying a frequency of the electrical output during the applying;

receiving, from each of the intersecting piezoelectric strands, a corresponding piezoelectric electrical output generated by the intersecting piezoelectric strand, wherein the corresponding piezoelectric electrical output of each of the intersecting piezoelectric strands is generated in response to mechanical stress applied to the intersecting piezoelectric strand at the corresponding intersection area as a result of the mechanical reaction by the piezoelectric strand;

determining, based at least in part on the corresponding piezoelectric electrical outputs, whether any external force is being applied at each of the corresponding intersection areas; and determining a material of an object applying the external force at a given intersection area of the corresponding intersection areas, wherein determining the material of the object is based on one or more variances in the corresponding piezoelectric electrical output of a given intersecting piezoelectric strand of the intersecting piezoelectric strands, wherein the given intersecting piezoelectric strand intersects the piezoelectric strand at the given intersection area.

15. The method of claim 14, further comprising determining a measure of force being applied at a given intersection area of the corresponding intersection areas, wherein determining the measure of force is based on the corresponding piezoelectric electrical output of a given intersecting piezoelectric strand of the intersecting piezoelectric strands, wherein the given intersecting piezoelectric strand intersects the piezoelectric strand at the given intersection area.

16. The method of claim 14, further comprising:
applying additional electrical output to an additional piezoelectric strand that intersects each of the intersecting piezoelectric strands at a corresponding additional intersection area, wherein applying the additional electrical output to the additional piezoelectric strand occurs after applying the electrical output to the piezoelectric strand, and wherein applying the additional electrical output to the additional piezoelectric strand generates an additional mechanical reaction by the additional piezoelectric strand;

receiving, from each of the intersecting piezoelectric strands, a corresponding additional piezoelectric electrical output generated by the intersecting piezoelectric strand, wherein the corresponding additional piezoelectric electrical output of each of the intersecting piezoelectric strands is generated in response to mechanical stress applied to the intersecting piezoelectric strand at the corresponding additional intersection area as a result of the mechanical reaction by the additional piezoelectric strand; and determining, based at least in part on the corresponding additional piezoelectric electrical outputs, whether any external force is being applied at each of the corresponding additional intersection areas.

* * * * *